United States Patent [19]

Uehara

[11] 4,075,496

[45] Feb. 21, 1978

[54] CHARGED PARTICLE IRRADIATION APPARATUS

[75] Inventor: Kenichiro Uehara, Osaka, Japan

[73] Assignee: Sumitomo Electric Industries, Ltd., Osaka, Japan

[21] Appl. No.: 703,143

[22] Filed: July 7, 1976

[51] Int. Cl.[2] .......... H01J 37/00

[52] U.S. Cl. .......... 250/492 B; 250/396 ML

[58] Field of Search .......... 250/492 B, 396 ML, 398; 219/121 EB

[56] References Cited

U.S. PATENT DOCUMENTS

| | | | |
|---|---|---|---|
| 2,897,365 | 7/1959 | Dewey et al. | 250/492 B |
| 3,104,321 | 9/1963 | Smith | 250/492 B |
| 3,629,578 | 12/1971 | LePoole | 250/396 ML |

*Primary Examiner*—Bruce C. Anderson
*Attorney, Agent, or Firm*—Sughrue, Rothwell, Mion, Zinn and Macpeak

[57] ABSTRACT

A charged particle beam generating apparatus irradiates an article on all sides thereof by scanning the beam across the article and magnetically curving the beam, when scanned away from the article, to the back side of the article. The magnetic structure provides a magnetic field normal to the scanning direction with a field intensity that is greater near the article than it is further from the article. This results in more nearly uniform irradiation of the entire peripheral surface of the article.

7 Claims, 12 Drawing Figures

EFFECTIVE BEAM CURRENT AT VARIOUS DISTANCES FROM BEAM WINDOW

CHARGED PARTICLE IRRADIATION APPARATUS

BACKGROUND OF THE INVENTION

The invention is in the field of apparatus for irradiating articles, such as coatings for wires, cables or the like, to improve the quality of the irradiated articles, and more particularly is directed to an apparatus for achieving a more nearly uniform irradiation of the entire peripheral surface of such articles.

It is well known in the art to irradiate materials having a high molecular weight, such as polyethylene and polyvinylchloride, to improve the quality thereof. Typically, electron beam irradiation is used, and the process has particular utility for improving the coatings of electric wires, cables, tubes and the like. When applied to such devices one of the problems encountered is how to uniformly irradiate the coatings from a charged particle beam emanating from one side of the article as the article is pulled through the field scanned by the beam. One reason why this is a problem is because the penetration depth of the beam is inversely proportional to the beam energy. For example the penetration depth of an electron beam of 2MeV is only 1 cm at most in water and about 0.1 cm in copper having a density of 8.9 $g/cm^3$. Therefore, when an article such as an electric cable is irradiated by an electron beam emanating from one side thereof, the back side will be shielded by the core conductor of copper and the portion of the coating just behind the conductor will receive no radiation.

In order to guide the electron beam to the back or far side of the cable, it is usual to employ a pair of magnetic structures to deflect electron beams incident normally thereto toward the corresponding halves of the cable. The magnetic structures, each of which includes a magnet and a pair of pole pieces for forming a suitable magnetic field therebetween, are arranged in parallel such that the polarities of the pole pieces and the magnets are opposite in direction, to produce a pair of oppositely polarized, parallel magnetic fields. The cable is passed through a space between the magnetic structures, with half of the cable subjected to one polarity magnetic field and the other half to an opposite polarity magnetic field.

One example for carrying out latter process is disclosed in Japanese Patent Publication No. 435/1960. However the apparatus described does not take into consideration magnetic leakage at the end portions of the magnet (the so-called fringing effect) and the corresponding electron energy loss. Also, with path travelled through the magnetic fields by the electron beams is quite long resulting in an energy loss and therefore current decrease of the electron beam. Consequently the apparatus has not been practical.

As another example, where the article to be irradiated is a tube of a large diameter, e.g. 60 mm., it is usual to support the tube rotatably by a conveyer and rotate it under a unidirectional irradiation. In such case, assuming the tube is of for example, polyethylene which exhibits a good insulator property and is irradiated with, for example. 2MeV beam, the electrons are accumulated excessively in portions of the wall of the tube around 2mm depth and they are discharged subsequently. This is referred to as Lichtenberg phenomenon and the result thereof is referred to as Lichtenberg discharge.

SUMMARY OF THE INVENTION

The present invention is intended to overcome the disadvantages of the prior art, including the method of Japanese Patent Publication No. 435/1960, by minimizing the path length of the electron beam to minimize the energy loss thereof.

According to the present invention there is provided a magnetic apparatus comprising a pair of magnetic field generating structures which generate opposite polarity d.c. magnetic fields. An article to be irradiated with charged particles passes through a space between said pair of magnetic structures. The magnetic field produced by each magnetic generating structure is non-uniform and deflects the particle beams such that the effective energy of the beams impinging on the peripheral surface of the article becomes uniform.

DESCRIPTION OF THE DRAWINGS

FIG. 1 shows an embodiment of the present invention in which

DESCRIPTION OF THE EMBODIMENTS

Figure 1A:
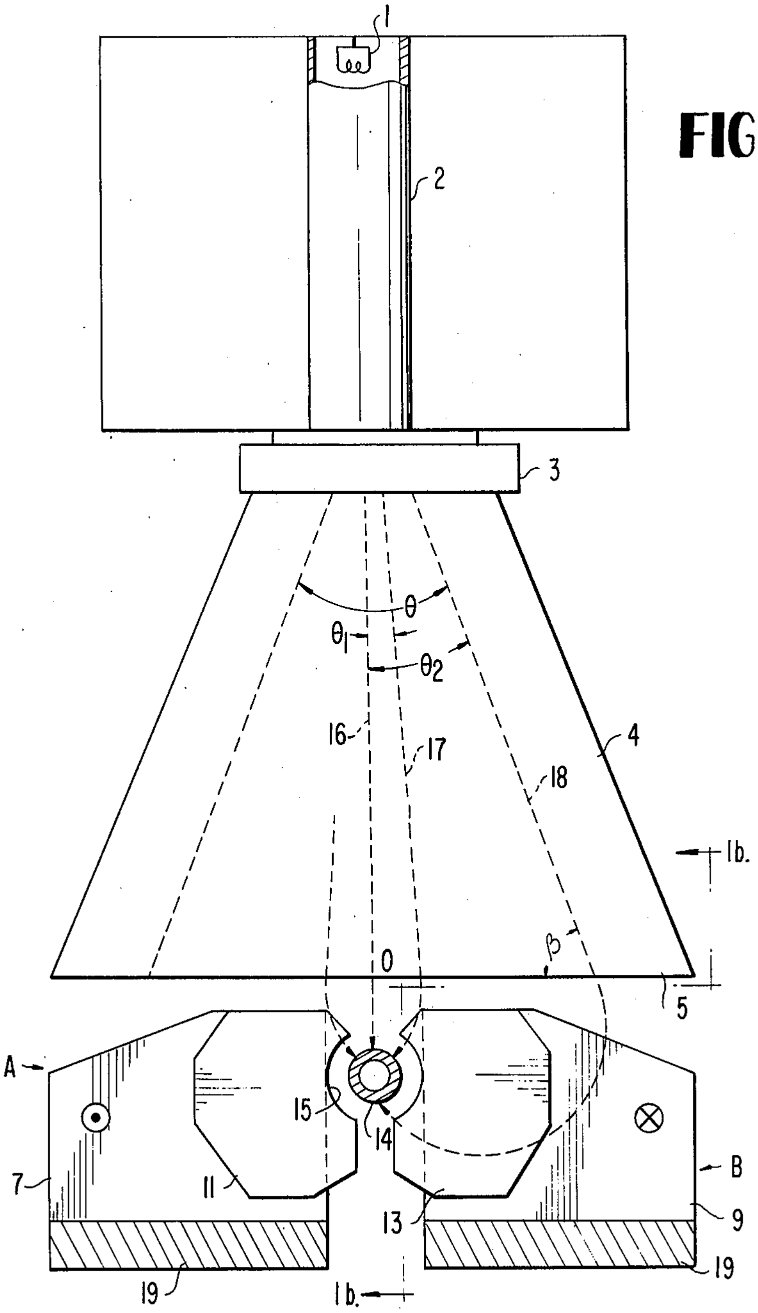
FIG. 1*a* is a front view.

Referring to FIG. 1, an electron beam accelerator comprises an electron source 1, an accelerator tube 2 connected to the electron source 1, an electron beam scanning device 3 connected to the accelerator tube 2 and an electron beam guiding portion 4 connected to the beam scanning device 3. Electrons emitted from the source 1 are accelerated in the accelerator tube 2 to form an electron beam. The electron beam is periodically deflected by the beam scanning device 3 such that it swings through an angle $\theta$. The components described thus far are conventional. Downstream of the scanner 4, a pair of magnetic field generating structures A and B are provided for guiding the electron beams to the coated wire 14 which is the article to be irradiated. Since the structure A is the same as the structure B except for the orientation of magnets, only the structure A will be described in detail. The structure A comprises a magnet 19 and a pair of pole piece assemblies. One of the pole piece assemblies is composed of an outer yoke 6, an inner yoke 10, and an intermediate yoke 20 disposed between the outer yoke 6 and the inner yoke 10 to magnetically connect these yokes. The other pole piece assembly is composed of an outer yoke 7, an inner yoke 11, and an intermediate yoke 20 disposed therebetween to magnetically connect the yokes 7 and 11. All yokes are formed of conventional materials which are suitable for conducting the magnetic field created by the magnet 19. The outer yokes 6 and 7 are in contact with the S and N poles of the magnet 19, respectively. Therefore a d.c. magnetic field exists between outer yoke plates 6 and 7 across the space therebetween, and a stronger d.c. magnetic field exists between the inner yokes 10 and 11 across the space therebetween. In structure B the fields are the same but the polarities are reversed.

The shapes of the inner yokes 10 and 11 are symmetrical and have notch portions 15 which, when the whole magnetic structures A and B are assembled in place, provide a space or path through which the cable to be irradiated is run.

Figure 1B:
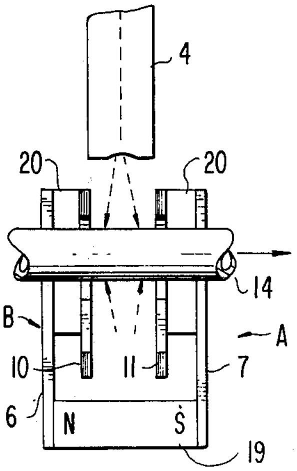
FIG. 1*b* is a fragmentary sectional view taken along line 16—16 of FIG. 1*a*.
Figure 1C:
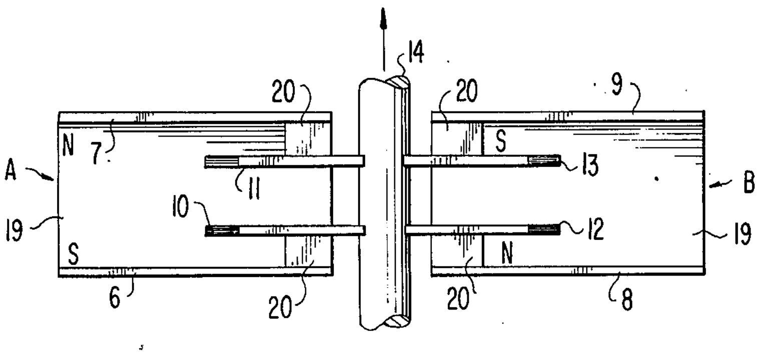
FIG. 1*c* is a plane view.
Figure 1D:
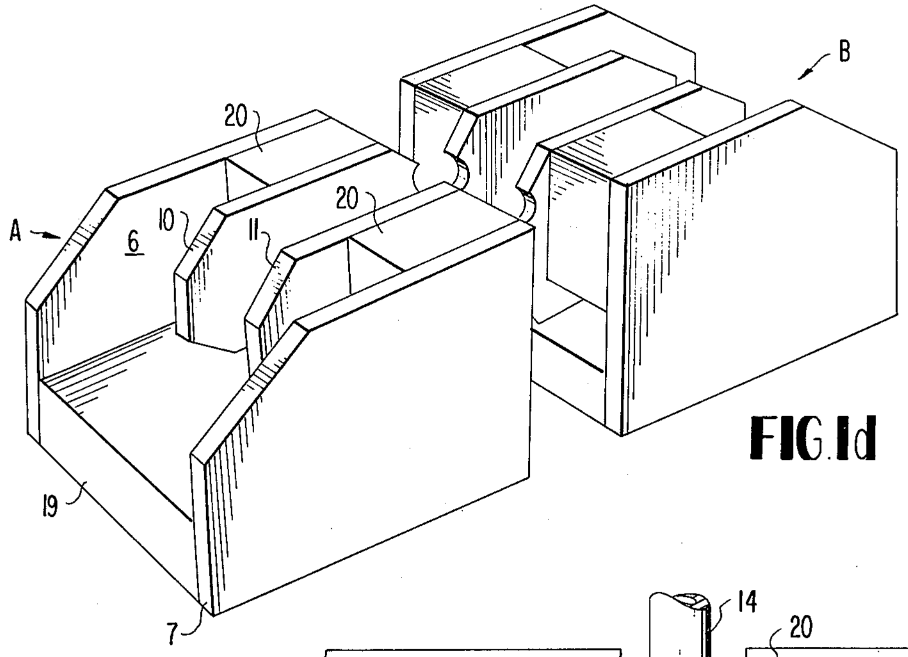
FIG. 1*d* is a perspective view of the magnetic structures of FIGS. 1*a* - 1*b*.

The magnetic structures A and B are disposed downstream of the scanner 3 and produce d.c. magnetic fields opposite in polarity to each other, as shown in FIG. 1*c*, and normal to the plane along which the electron beam is scanned, as shown in FIGS. 1*a* and 1*b*, so that the magnetic neutral plane between the magnetic structues A and B coincides with the center line 16 of the scanning device 4. The article 14 which is to be irradiated is run through the space defined by the notches 15 of the inner yokes 10, 11, 12 and 13 of the magnetic structures A and B in the direction normal to the center line 16.

Figure 2:
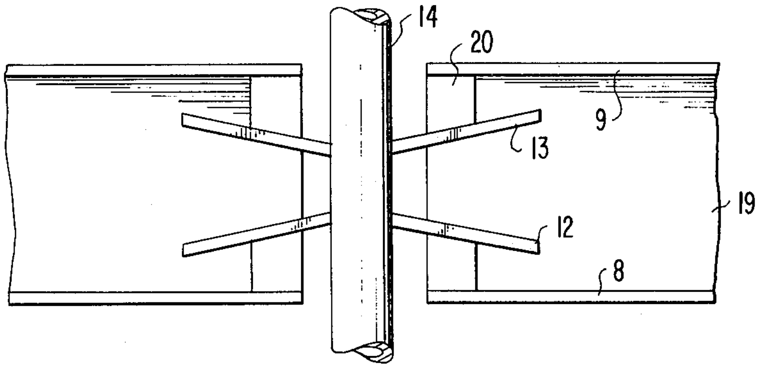
FIG. 2 illustrates a modification of the inner yokes of the embodiment of FIG. 1.

The configuration of each of magnetic structure is such that the space between opposite polarity yokes is non-uniform, with the space being smaller near the center line. In the particular embodiment of FIG. 1, the space is stepped. That is, around the center line O, the space is defined by the inner yokes 10 and 11 which is narrower than that defined by the outer yokes 6 and 7. Although the variation of space is stepped in FIG. 1, it is also possible to change the space continuously by angling the outer yoke plates, or by a combination of stepping and angling such as shown in FIG. 2, wherein there is a step in the magnetic field from the outer plates to the inner plates, and thereafter the field increases in a continuous manner to the edge of the inner plates. Also the number of steps is not limited to two as shown, but can include any number, provided that the field strength becomes greater at each step closer to the article.

The peripheral contour of each of the inner yokes 10, 11, 12, and 13 is generally polygonal as shown in FIG. 1*a* and has the round notch 15 as mentioned previously. The effect of the polygonal contour will be described later.

Electrons discharged from the electron emitting source 1 in the accelerator 2 are accelerated by the latter to form an electron beam. The electron beam is scanned by the scanner 3 through an angle $\theta$ in a plane normal to the cable 14 and to lines of flux between the yokes. The magnetic field intensity around the area defined by the notches 15 of the opposite inner yoke pairs is substantially zero because the magnetic structures A and B produce opposite d.c. magnetic fields which cancel one another around the latter area. Therefore, electron beams along center line 16 reach the front portion of cable 14 without deflection by the magnetic fields. Electron beam 17, having a small angle $\theta_1$ with respect to the center line, enters into the intense magnetic field between the inner yokes and is strongly deflected by the field to reach the upper side portion of the cable 14 as shown. Electron beam 18 having a large angle $\theta_2$ with respect to the center line, enters initially into the weaker magnetic field between the outer yokes and is relatively weakly deflected. After a portion of its jorney through the weak magnetic field the beam 18 enters the strong magnetic field where it is strongly deflected and brought to impinge against the rear portion of the cable 14, as shown. The locus of the electrons is determined by the intensities of the magnetic fields the velocity of the electrons and the peripheral contours of the yokes. Therefore, these factors should be determined according to the locus desired.

It will be understood by those skilled in the art that, by providing a local intense magnetic field within the basic magnetic field, radius of curvature and thus the moving distance of the electron can becomes smaller than that in the conventional apparatus such as that disclosed in Japanese Patent Publication No. 435/1960. That is, in the conventional apparatus which uses a uniform magnetic field intensity the electrons move in the uniform field along a locus having a constant radius of curvature while in the present invention, the electrons move in the basic field along a locus having a first constant radius of curvature and then along a locus having a constant but shorter radius of curvature. Therefore, loss of electron energy becomes very small in the present invention.

The contours of yoke plates 6 thru 13 should be determined by taking into consideration the energy loss due to collisions with oxygen and nitrogen molecules in the atmosphere and the variation of electron beam density due to the scattering thereby.

Figure 3:
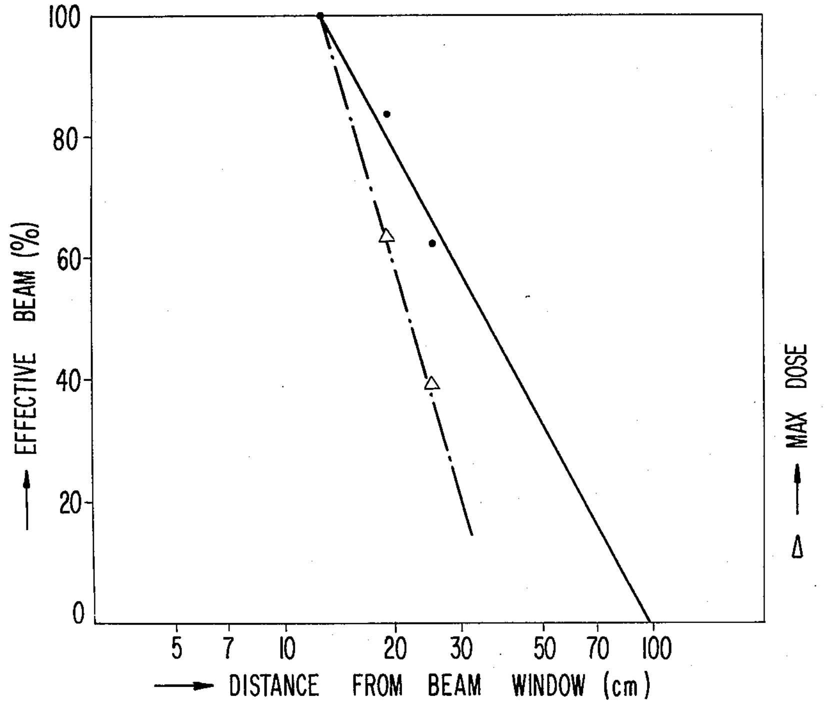
FIG. 3 is a graph showing the relative effect of a 2MeV electron beam with respect to the path length of the beam from the window of a beam scanner.
Figure 4:
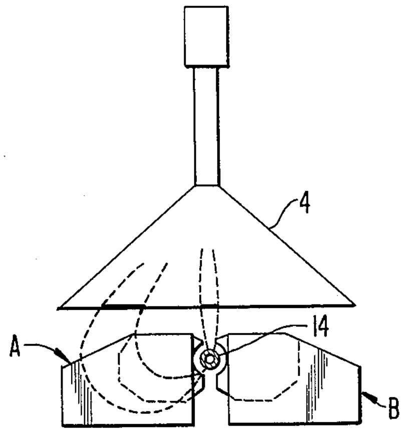
FIG. 4 illustrates the principle of operation of the present invention.

FIG. 3 is a graph showing relative electron beam energy density plotted along the ordinate versus distance from the electron discharging window 5 plotted along the abscissa for a 2MeV electron beams passing within a gap between inner yokes 12 and 13 of 10 cm. As will be clear from FIG. 3, the electron density decreases considerably with distance. However, in order to irradiate the article 14 uniformly, the electron energy density of the beam irradiating the far side surface of the article should be the same as that irradiating the front side of the article. This can be achieved, according to the present invention, by shaping the respective yokes as polygons and providing a local intense magnetic field adjacent the article so that the greater the angle $\theta$ relative to the center line, the greater the turn taken by the beam, resulting in a reconcentration of the beam as it passes through the intense field. This feature is diagramatically indicated in FIG. 4. The result is a more uniform irradiation as well as a reduction in the average path length of the beams.

Figure 5:
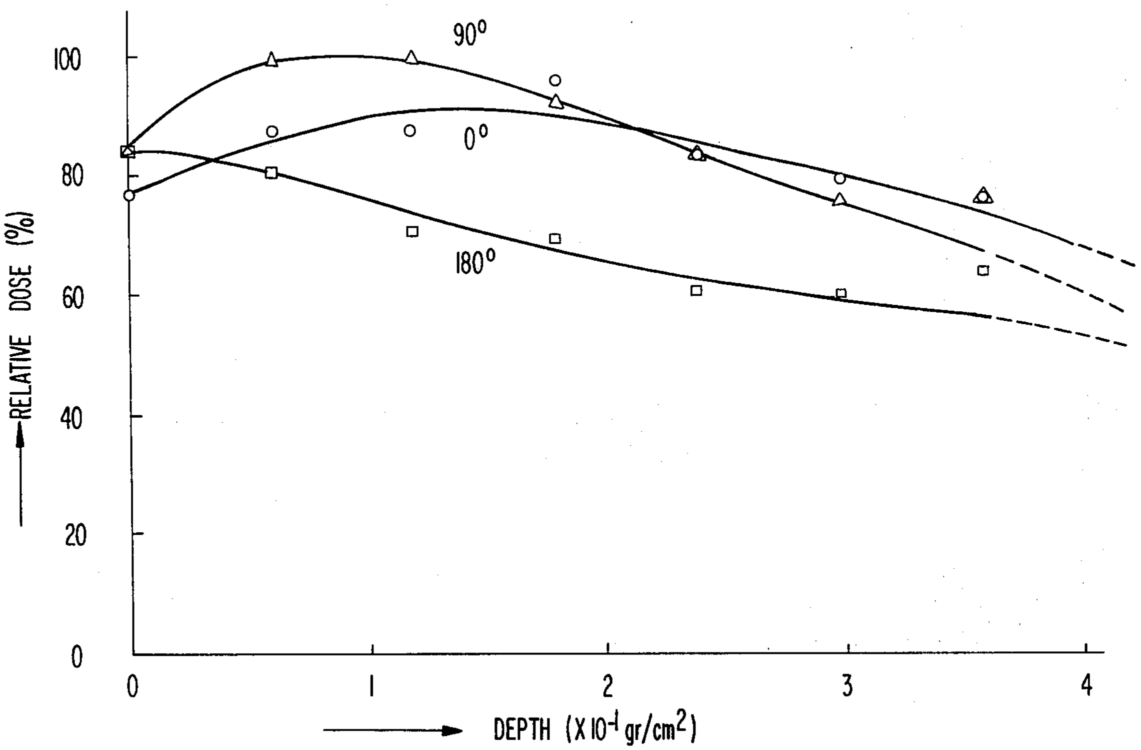
FIG. 5 is a graph showing relative dose of electrons absorbed by a cable coating versus depth of the coating for several points on the periphery of the article irradiated.
Figure 6:
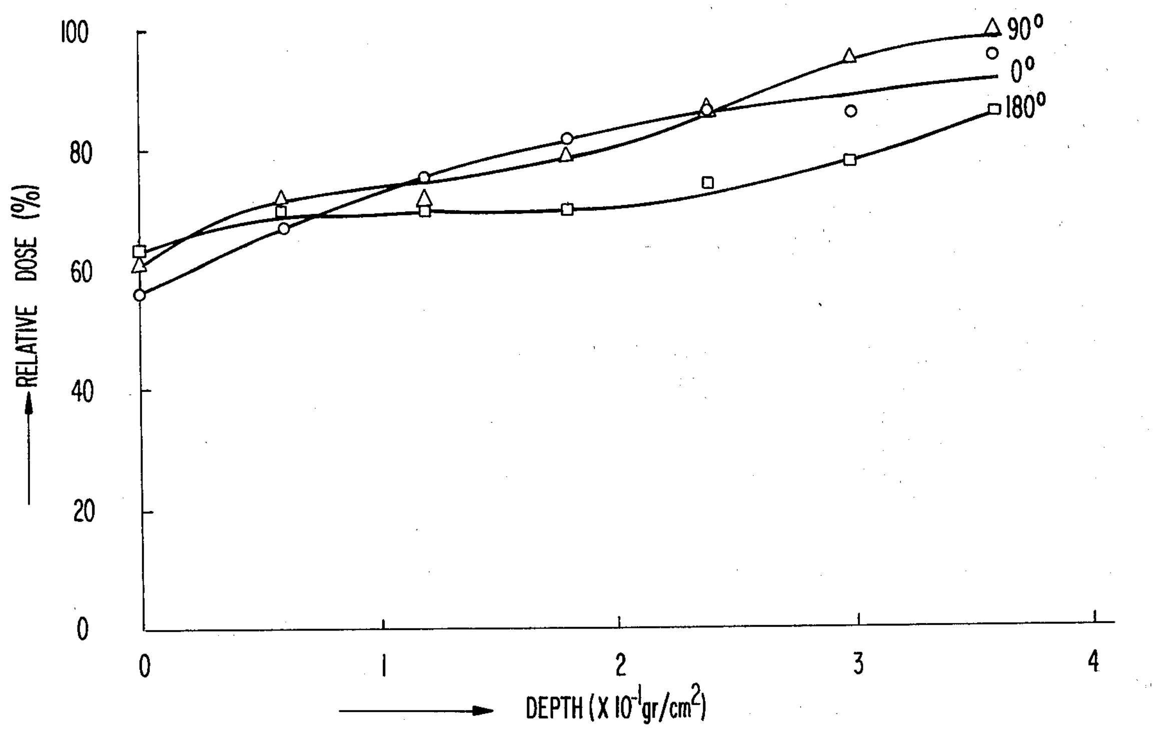
FIG. 6 is a graph showing relative dose of electrons absorbed by a tube versus depth of the tube wall for several points on the periphery of the tube.

The performance of the present apparatus applied to a 1.8 MeV accelerator having electron scanning length of 100 cm i.e., the distance, at the window of scanner 5, between the furthest beams defining the angle of the scan, will be described. The magnetic structure used was as shown in FIG. 1, with the distance between surfaces 10 and 11 being 10 cm and the maximum flux density in the space being about 500 gauss, and the distance between surfaces 7 and 8 being 25 cm and the flux density in the space being about 300 gauss. The locus of movement of electrons discharged into the space between the yokes was a radius of curvature of about 15 cm in the magnetic field between the plates 10 and 11 and about 28 cm in the magnetic field between the plates 7 and 8. FIGS. 5 and 6 show data obtained by measuring the absorbed dose of electrons for an elongated sample and a tube like sample, respectively, of material having density of 1.0 g/cm$^3$ and an outer diameter and wall thickness being 40 mm and 4 mm respectively. The different curves represent the dose at different points around the article, specifically the points of 0°, 90°, and 180°.

Table 1 shows gel fraction of each of six equal sectors of two sample tubes of polyethlene; the outer diameter and wall thickness of both being 50 mm and 3 mm, respectively, when the tubes were irradiated with the apparatus described above.

Table 1

| sample | gel % | | | | | | average gel % |
|---|---|---|---|---|---|---|---|
| 1 | 70.4 | 69.2 | 70.0 | 68.4 | 70.0 | 68.5 | 69.4 |
| 2 | 71.1 | 67.7 | 71.6 | 71.9 | 67.0 | 67.9 | 69.5 |

In this case about 40% of electron beam energy was utilized.

It is clear from the above results that according to the present apparatus, very thick articles can be irradiated effectively with a quite uniform electron beam density.

Further, it has been found during the measurement that there is no so-called Lichtenberg discharge in the article having a very large outer diameter irradiated the present apparatus.

Figure 7:
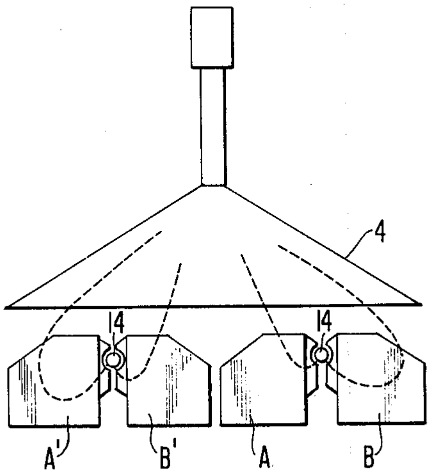
FIG. 7 is another embodiment of the present invention.
Figure 8A:
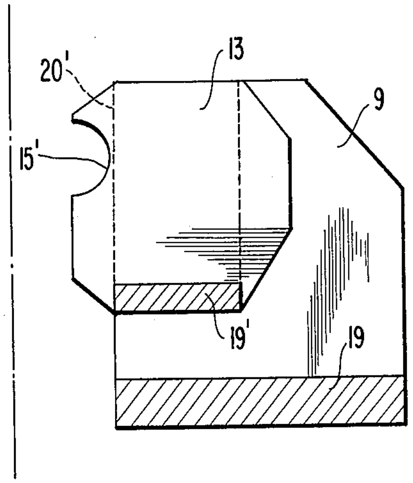
FIGS. 8*a* and 8*b* illustrate a further embodiment of the present invention.
Figure 8B:
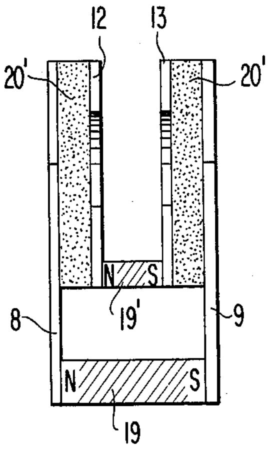

The magnetic structures A and B in FIG. 1 can be modified with substantially the same effect as obtainable by the embodiment in FIG. 1. For example, a plurality of the magnetic structure pairs can be arranged below a common electron discharging window as shown in FIG. 7. Further it is possible to provide another magnet between the inner yokes of each magnetic structure as shown in FIG. 8, in which case the interconnecting yokes 20 may be replaced by magnetic insulator blocks 20' of non-magnetic material.

What is claimed is:

1. A charged particle irradiation apparatus of the type having a charged particle accelerating means including an accelerator tube, a charged particle discharging means connected to said accelerator tube and having an opening at the opposite end thereof and a scanning means for scanning the charged particle beam in a first plane, and means including at least a pair of magnetic structures disposed downstream of said opening and being symmetrically positioned about a center line of said scanning pattern to produce opposite d.c. magnetic fields in directions normal to said first plane for deflecting the beam toward a space between said magnetic structures, and an article to be irradiated with the charged particle beam being moved through said space in direction normal to said first plane, wherein the improvement comprises each said magnetic structure having a magnet and a pair of yokes magnetically connected to the opposite poles of said magnet to provide a gap therebetween, across which are lines of magnetic flux normal to said first plane and through which said charged particles pass, said gap being non uniform to produce a non uniform magnetic field intensity with the magnetic field in said gap being greater near said inter magnetic structure spce than it is farther from said space, a magnetic neutral plane disposed in said space which is produced by the cancellation of said opposite d.c. magnetic fields, said deflected charged particles irradiating completely about said article, said magnetic neutral plane being normal to the first plane and intersecting the first plane at the center line thereof and bisecting the space between the magnetic structures.

2. A charged particle irradiation apparatus as set forth in claim 1, wherein the distance between said pair of yokes is continuously narrowed toward said space.

3. A charged particle irradiation apparatus as set forth in claim 1, wherein each of said pair of yokes comprises an outer plate, an inner plate and a magnetic connection between said outer and inner plates, said inner plates of said pair of yokes defining a first gap therebetween and said outer plates of said pair of yokes defining a second gap therebetween larger than said first gap and farther from said inter-magnetic structure space whereby said non uniform magnetic field intensity is a stepped non-uniformity.

4. A charged particle irradiation apparatus as set forth in claim 1, wherein peripheral contours of said pair of yokes are polygonal.

5. A charged particle irradiation apparatus as set forth in claim 1, wherein peripheral contours of said pair of yokes are elliptical.

6. A charged particle irradiation apparatus as set forth in claim 3, wherein a second magnet is provided between said inner plates of each pair of pole pieces.

7. A charged particle irradiation apparatus as claimed in claim 1 further comprising a plurality of substantially identical pairs of magnetic structures, all of said pairs being arranged in said first plane, and each of said pairs having an article to be irradiated that is passed through the intermagnetic structure space in a direction normal to said first plane, a separate magnetic neutral plane disposed in each of said spaces which is produced by the cancellation of said respective opposite d.c. magnetic fields, said scan being large enough to intercept all said articles so that said deflected charged particles irradiate completely about each of said articles.

* * * * *